United States Patent
Chatterjee

(10) Patent No.: US 6,791,383 B2
(45) Date of Patent: Sep. 14, 2004

(54) REDUCED GATE LEAKAGE CURRENT IN THIN GATE DIELECTRIC CMOS INTEGRATED CIRCUITS

(75) Inventor: Amitava Chatterjee, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 179 days.

(21) Appl. No.: 10/265,850

(22) Filed: Oct. 7, 2002

(65) Prior Publication Data

US 2004/0067600 A1 Apr. 8, 2004

(51) Int. Cl.$^7$ .............................. H03L 7/06; H01L 21/00
(52) U.S. Cl. ........................................ 327/156; 438/396

*Primary Examiner*—Evan Pert
(74) *Attorney, Agent, or Firm*—Peter K. McLarty; W. James Brady, III; Frederick J. Telecky, Jr.

(57) ABSTRACT

The invention describes a method for reducing the leakage current in thin gate dielectric MOS capacitors in integrated circuits. A bias voltage is determined for the MOS capacitor such that the capacitor area and leakage current constraints are satisfied. The MOS capacitor is not biased in inversion.

9 Claims, 4 Drawing Sheets

REDUCED GATE LEAKAGE CURRENT IN THIN GATE DIELECTRIC CMOS INTEGRATED CIRCUITS

FIELD OF THE INVENTION

The present invention relates to a method to reduce the gate leakage in metal oxide semiconductor capacitors formed in thin gate dielectric CMOS integrated circuits.

BACKGROUND OF THE INVENTION

Capacitors are often required on integrated circuits to perform certain circuit functions. Although a number of different integrated circuit capacitors are possible, the most common type in use today is the metal oxide semiconductor (MOS) capacitor. In this device the gate dielectric acts as the capacitor dielectric. The plates of the capacitor are formed using the gate structure and the semiconductor substrate. A simple MOS capacitor is shown in FIG. 1. The semiconductor substrate 10 functions as one of the plates of the capacitor. The semiconductor can be doped either n-type or p-type. As shown in FIG. 1 the substrate can be connected to circuit ground 13. A dielectric layer 11 formed on the surface of the semiconductor substrate 10 functions as the capacitor dielectric. In the case of a silicon substrate the dielectric layer typically comprises silicon oxide or a silicon oxynitride. A gate structure 12 formed on the dielectric layer 11 functions as the second plate of the capacitor. Diffusion regions 16 will function as a source and sink form minority carriers required to form an inversion region beneath the gate 12 when the capacitor is biased in inversion. For a n-type substrate region 10 the diffusion regions will be p-type and for a p-type substrate the diffusion region 16 will be n-type. The diffusion regions 16 will also be connected to circuit ground 13. The capacitance value of the MOS capacitor is a function of the bias voltage Va 14 applied to the gate 12. The three well-defined states of the MOS capacitor are inversion, accumulation and depletion. These states are induced in the MOS capacitor through the application of various bias voltages Va to the gate 12. The states are described in relation to the applied voltage Va and two conditions of the MOS capacitor, flatband voltage $V_{FB}$ and threshold voltage $V_{TH}$. Given a particular work function difference between the substrate 10 and the gate 12, the flatband voltage $V_{FB}$ is defined as that voltage which when applied to the gate 12 results in the silicon substrate beneath the gate being everywhere neutral. See MOS (Metal Oxide Semiconductor) Physics and Technology by E. H. Nocollian and J. R. Brews, page 41. The threshold voltage $V_{TH}$ is defined as that voltage which when applied to the gate 12 results in the maximum width of the depletion region 15. See Physics of Semiconductor Devices by S. Sze, page 373. Using the above definitions of $V_{FB}$ and $V_{TH}$ the three states of the MOS capacitor can be written in terms of the applied voltage as follows:

(a) $Va<V_{TH}$ (inversion), $V_{TH}<Va<V_{FB}$ (depletion), $Va>V_{FB}$ (accumulation) for an n-type substrate, and (b) $Va>V_{TH}$ (inversion), $V_{FB}<Va<V_{TH}$ (depletion), $Va<V_{FB}$ (accumulation) for a p-type substrate.

For a dielectric layer 11 with a dielectric permittivity of $\in$ and thickness d the capacitance per unit area in strong accumulation and strong inversion is given by, $$C_m = \in/d.$$

In the ideal case the capacitance value of the MOS capacitor is a maximum in strong inversion and strong accumulation and passes through a minimum as the MOS capacitor passes through depletion. Shown in FIG. 1 is a depletion region 15 formed in the semiconductor substrate 10 beneath the gate structure 12. For the case of an n-type substrate, the depletion region 15 is formed by applying a voltage $Va<V_{FB}$ to the gate 12. For a p-type substrate a voltage $Va>V_{FB}$ applied to the gate 12 will form the depletion region 15. For a depletion region thickness of $d_1$ and a silicon permittivity of $\in_s$ the capacitance per unit area is given by, $$C = C_m C_d/(C_m + C_d),$$

where $C_d$ is given by $\in_s/d_1$. Since $d_1$ is a function of the applied bias voltage Va then the capacitance C is also a function of the applied bias voltage Va.

An unwanted component of a MOS capacitor is the leakage current $I_L$ that flows through the gate dielectric layer 11 when a bias voltage Va is applied to the gate 12. In general the leakage $I_L$ is a function of the bias voltage applied Va and the dielectric layer thickness d. The leakage current $I_L$ increases as the thickness of the dielectric layer d is reduced. It should be noted that the capacitance per unit area of the MOS capacitor increases as the dielectric layer thickness d is reduced.

There are many integrated circuit applications that utilize MOS capacitors. One such application is the phase lock loop (PLL). The PLL is used in many applications such as wireless telephones, receiver circuits, and network servers. A PLL is a circuit that causes a particular system to track with one another. More precisely, a PLL is a circuit synchronizing an output signal (generated by an oscillator) with a reference or input signal in frequency as well as in phase. In the synchronized or locked state, the phase error between the oscillator's output signal and the reference signal is zero, or very small. If a phase error builds up, a control mechanism acts on the oscillator in such a way that the phase error is again reduced to a minimum. In such a control system the phase of the output signal is actually locked to the phase of the reference signal. A block diagram of a phase lock loop is shown in FIG. 2(a).

The PLL consists of three basic functional blocks: a voltage-controlled oscillator 30, a phase detector 20, and a loop filter 25. In general an input signal $U_1(t)$ is fed to the phase detector 20 along with the output signal $U_2(t)$ from the voltage controlled oscillator 30. The output signal from the phase detector $U_d(t)$ is fed into the loop filter. In general the loop filter is a low pass filter with an output signal $U_f(t)$ that comprises only low frequency or DC components. The output signal of the loop filter $U_f(t)$ is fed into the voltage controlled oscillator 30. The output signal $U_2(t)$ of the voltage controlled oscillator 30 will depend on the input signal $U_f(t)$. As stated above the loop filter 25 comprises a low pass filter. Such a low pass filter will comprise one or more capacitors often referred to as loop filter capacitors. An example of a low pass filter with a loop filter capacitor is shown in FIG. 2(b). Here the loop filter capacitor 50 is in the feedback loop of the amplifier 60 which has a resistance 40 connected to the input terminal. In integrated circuit implementations of a PLL circuit MOS capacitors are often used to form the loop filter capacitors.

In an integrated circuit PLL, MOS capacitors are often used to form the capacitors in the loop filter circuit. The dielectric layer thickness d used to form the capacitors is often the same layer used as the gate dielectric of the MOS transistors and is often less than 50A. The thin dielectric layer thickness d will result in increased leakage current $I_L$ through the capacitor. The proper operation of the PLL requires that the loop filter capacitors introduce very little leakage current into the circuit. As shown in FIG. 2(a), the output from the loop filter is fed into the voltage controlled oscillator. Leakage current introduced into the circuit through the loop filter capacitors will add to the input of the voltage controlled oscillator. The additional input signal to the voltage controlled oscillator can cause the PLL to drift and unlock. Using a second dielectric layer that is thicker than d can reduce the leakage current. However, there is significant cost associated with depositing and patterning such a layer for the capacitor. There is therefore a need for a method to reduce the leakage current in MOS capacitors without increasing the dielectric layer thickness d.

SUMMARY OF INVENTION

The instant invention is a method for reducing the leakage currents in MOS capacitors formed using thin gate dielectric layers. In a first embodiment the method comprises first determining the value of capacitor required in the integrated circuit. Since integrated circuits usually have an area constraint, a maximum allowable area $A_{MAX}$ for the MOS capacitor is then determined. The maximum allowable current $I_{MAX}$ that can pass through the MOS capacitor and not affect the proper operation of the circuit is determined. The method then involves determining a capacitor bias voltage Va such that the capacitor bias voltage Va results in a second capacitance value and a second capacitor current such that said second capacitance value is approximately equal to said first capacitance value and said second capacitor current is less than said maximum allowable current. The method is also constrained by determining the capacitor bias voltage Va that results in the MOS capacitor with an area A such that said area A is less than said maximum allowed area $A_{MAX}$. The capacitor area A is determined from a capacitance voltage characteristic curve.

In a second embodiment the method comprises determining a value of total capacitance required for an integrated circuit. A capacitance value of a metal insulator metal capacitor is determined as well as a maximum allowable area $A_{MAX}$ for a MOS capacitor. The maximum allowable current $I_{MAX}$ for the MOS capacitor is determined; and a MOS capacitor bias voltage Va is found wherein the MOS capacitor bias voltage Va results in a MOS capacitor current and a MOS capacitor area such that the MOS capacitor current is less than said maximum allowable current and the MOS capacitor area is less than said maximum allowable area and combining the capacitance of said MOS capacitor and said metal insulator metal capacitor approximately equals the total capacitance.

BRIEF DESCRIPTION OF THE DRAWINGS

For a more complete understanding of the present invention and the advantages thereof, reference is now made to the following description taken in conjunction with the accompanying drawings, wherein like reference numerals represent like features, in which.

DETAILED DESCRIPTION OF THE INVENTION

Figure 1:
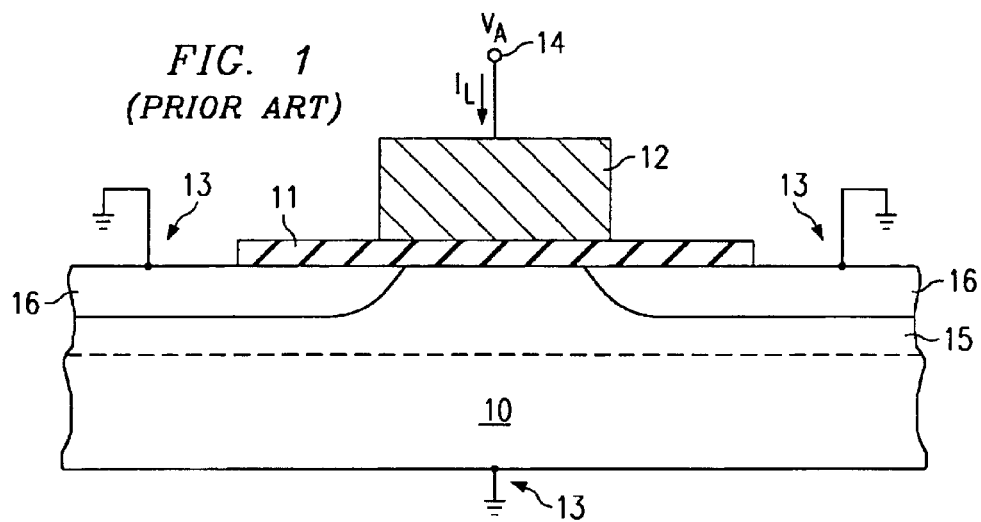
FIG. 1 is a cross-sectional diagram showing a MOS capacitor.
Figure 2A:
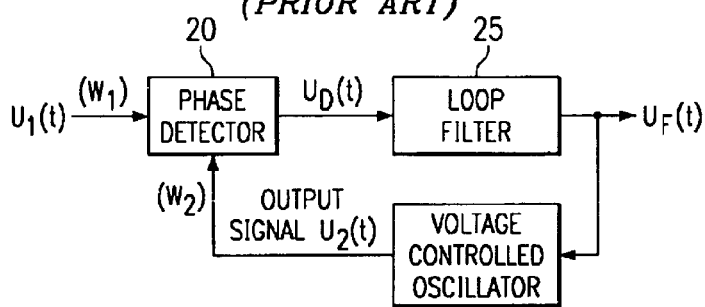
FIG. 2(a) is a functional block diagram of a phase lock loop.
Figure 2B:
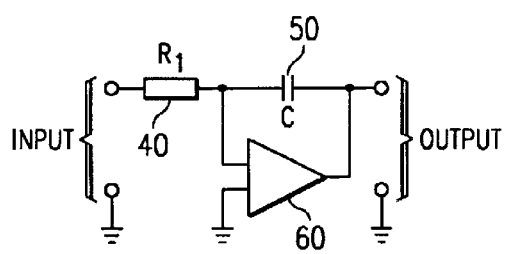
FIG. 2(b) is a circuit diagram of a low pass filter used in the loop filter circuit.
Figure 3:
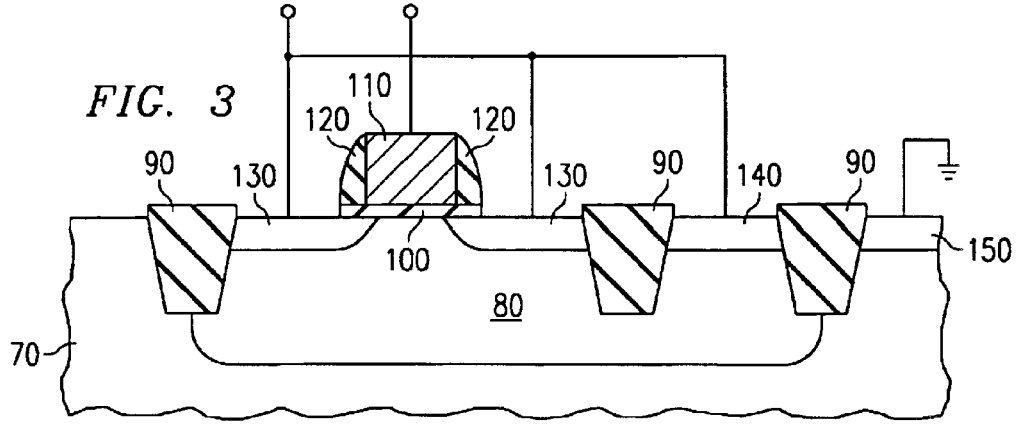
FIG. 3 is a typical integrated circuit MOS capacitor.

Shown in FIG. 3 is a typical integrated circuit MOS capacitor according to an embodiment of the instant invention. The MOS capacitor 65 is formed in a well region 80 that is formed in a semiconductor substrate 70. For a p-type substrate region 70 an n-type well region is formed by selectively implanting n-type dopants into the substrate 70. For an n-type substrate a p-well region will be formed by selectively implanting p-type dopants. Isolation regions 90 are shallow trench isolation (STI) structures or LOCOS structures depending on the required technology. Either isolation structure can be formed using known manufacturing techniques. The dielectric layer 100 functions as the MOS capacitor dielectric. In an embodiment of the instant invention this dielectric comprises silicon oxide, silicon oxynitride, silicon nitride, silicates or any suitable material. Typically this dielectric layer will be less that 40A thick. The MOS capacitor gate structure 110 is typically formed using doped polycrystalline silicon or a metal. The sidewall structures 120 are formed using a dielectric material such a silicon oxide or silicon nitride. The doped regions 130 are formed during the MOS transistor source and drain formation process. For an n-type well region 80 the doped regions 130 will be p-type and for a p-type well region 80 the doped regions 130 will be n-type. The doped regions 130 will function as a source and sink for minority carriers as the MOS capacitor is biased into and out of inversion. Doped regions 140 and 150 provide contact regions to the well region 80 and the substrate 70. The doped regions 140 and 150 will be the same conductivity type as the well region 80 and the substrate region 70. In a circuit the doped region 150 is typically tied to circuit ground and the MOS capacitor bias voltage Va is applied between the MOS capacitor gate structure 110 and the terminal formed by interconnecting 130 and 140.

Figure 5A:
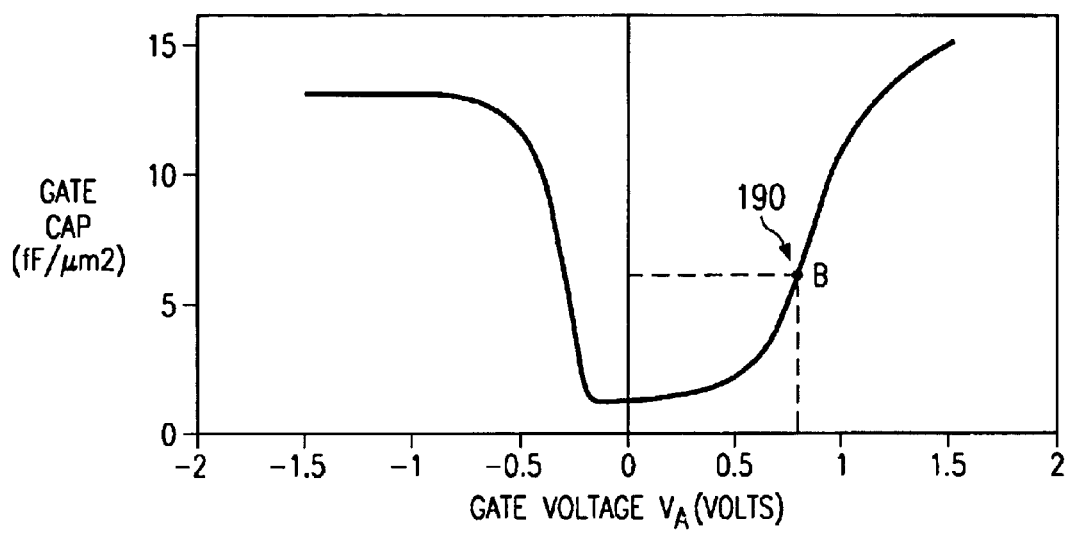
FIGS. 5(a) and 5(b) are capacitance voltage and current voltage characteristics respectively for a MOS capacitor showing a method of the instant invention.
Figure 5B:
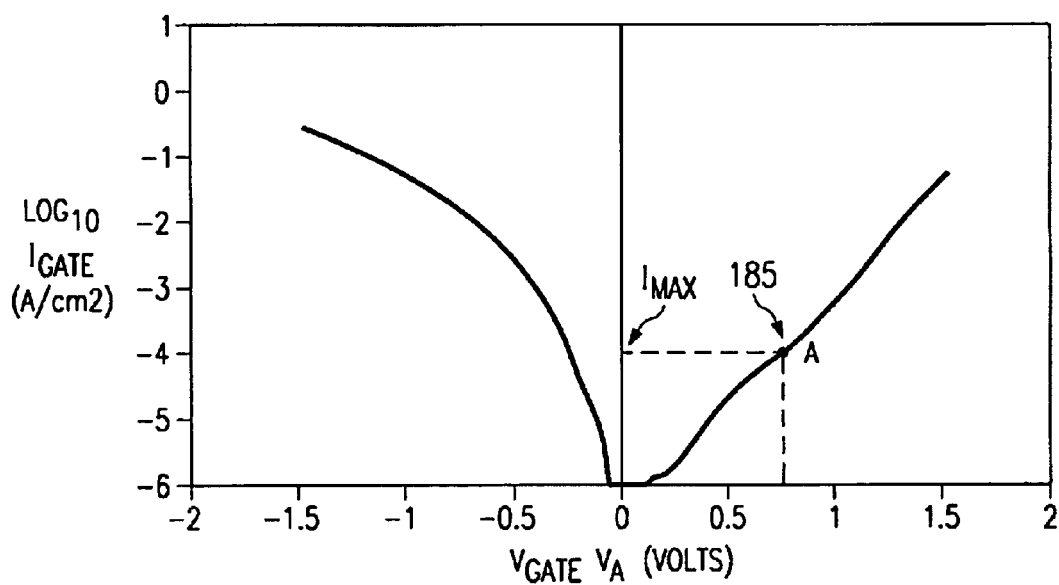

Shown in FIGS. 5(a) and 5(b) are a typical capacitance voltage characteristic curve and a current voltage characteristic curve respectively for a MOS capacitor with a gate dielectric thickness of approximately 24 Å. Referring to FIG. 5(a) the threshold voltage $V_{TH}$ is approximately −0.5 volts and the flat band voltage $V_{FB}$ is approximately 0.8 volts. Therefore for bias gate voltage Va less than −0.5 volts the MOS capacitor is in inversion. For bias voltages greater than −0.5 volts the capacitor is first biased in depletion and then into accumulation as the gate bias voltage Va is increased beyond 0.8 volts. Referring now to FIG. 5(b), the corresponding MOS capacitor current $I_L$ is shown as a function of the applied gate bias voltage Va. When the MOS capacitor is biased in inversion the leakage current obtained is many orders of magnitude larger than the leakage current obtained in depletion. In addition, the capacitance obtained is also much larger in inversion compared to depletion and accumulation. Because of the larger capacitance obtained MOS capacitors are typically biased in inversion for circuit applications. For critical applications such as the loop filter circuit in a PLL the leakage current obtained for thin gate dielectrics will cause the PLL to malfunction. A method is therefore needed to reduce the leakage current in the loop filter circuit of a PLL.

Figure 4:
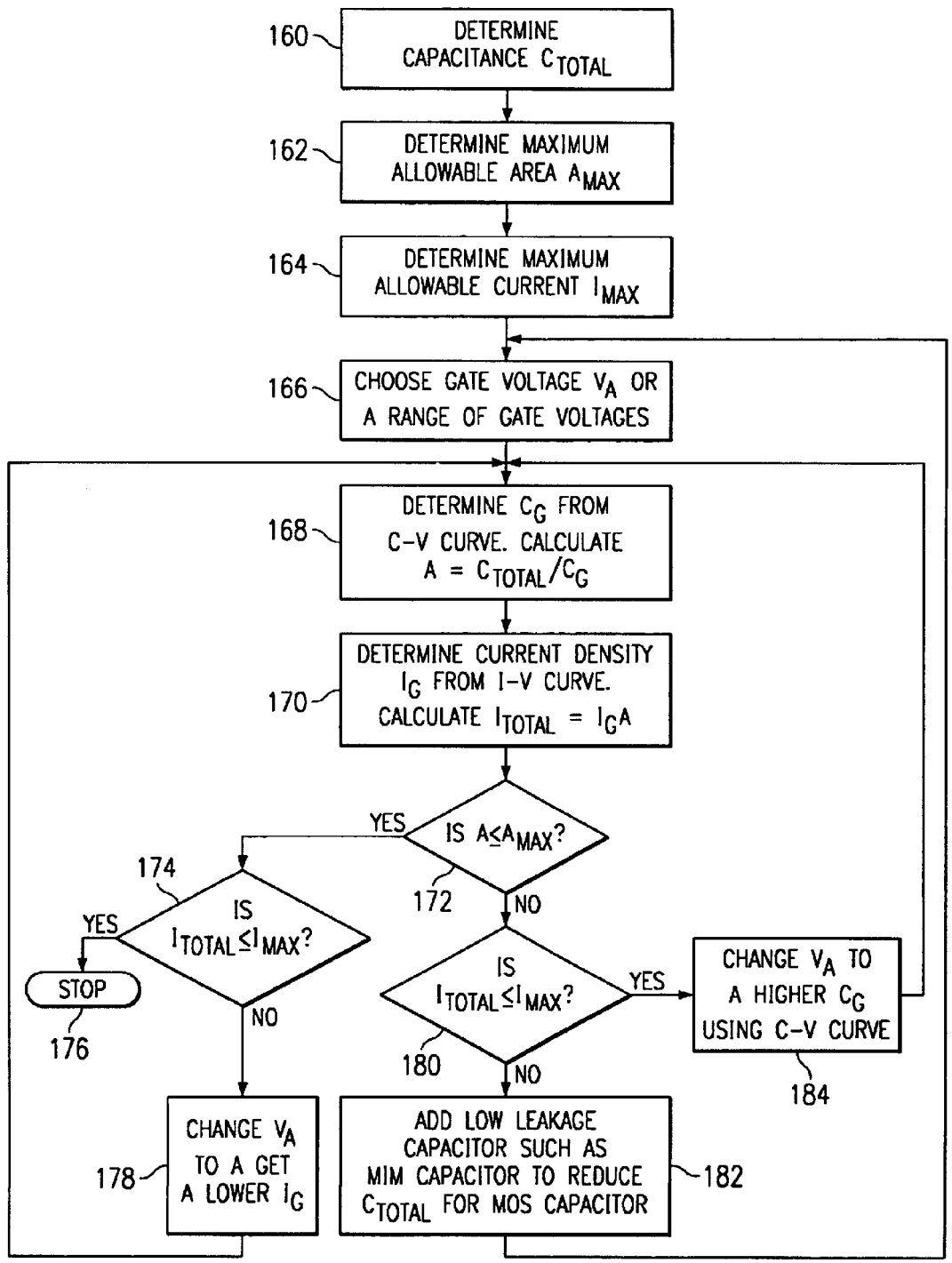
FIG. 4 is a flow chart outlining a method of the instant invention.

Shown in FIG. 4 is a method for reducing the leakage current in MOS capacitor circuits. The capacitance $C_{TOTAL}$ required for circuit operation is first determined 160. Since the MOS capacitor area is constrained in most integrated circuits, the maximum allowable area $A_{MAX}$ allocated to the MOS capacitor is determined 162. Using the circuit constraints of the PLL loop filter circuit the maximum allowable leakage current $I_{max}$ is determined 164. The gate voltage Va that is applied to the MOS capacitor during operation is often constrained by a number of factors including circuit parameters, oxide reliability, power supply and/or battery constraints, etc. Taking all the factors and constraints into account an operating gate voltage Va or a range of gate voltages is chosen 166. Using this value of gate voltage Va, the area A is calculated from the capacitance voltage curve shown in FIG. 5(a). Using the gate voltage Va from 166, a capacitance value C is read from FIG. 5(a). Point B 190 on FIG. 5(a) shows the capacitance obtained for a gate voltage Va of 0.8 volts. Using the value of capacitance C so obtained the area A is found by dividing $C_{TOTAL}$ by C (i.e. A=$C_{TOTAL}$/C). Using the value of gate voltage Va from 166 the current density $I_g$ is read from FIG. 5(b). This is illustrated by point A in FIG. 5(b) that shows the current density obtained for a gate voltage Va of 0.8 volts. The total current $I_{TOTAL}$ is then found by multiplying $I_{TOTAL}$ by A from 168. From 172, 174, and 176, if A≦$A_{MAX}$ and $I_{TOTAL}$≦$I_{MAX}$ then the current value of Va will result in required MOS capacitor characteristics. From 172, 174, and 178 if A≦$A_{MAX}$ but $I_{TOTAL}$>$I_{MAX}$ then a new value for Va is chosen and the process repeated. From 172, 180, and 182 if A>$A_{MAX}$ and $I_{TOTAL}$>$I_{MAX}$ then a low leakage metal insulator metal (MIM) capacitor is added and the process repeated.

Figure 7:
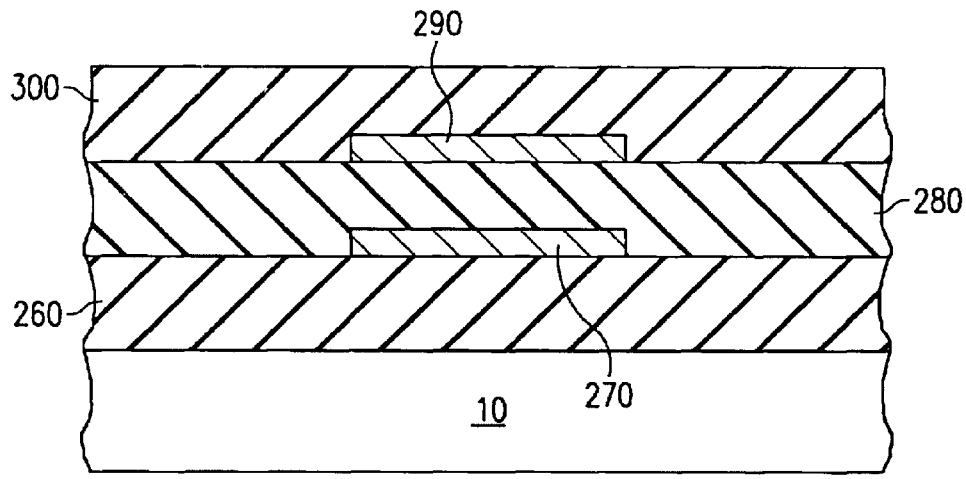
FIG. 7 is a cross sectional diagram of a parallel plate MIM capacitor.
Figure 8:
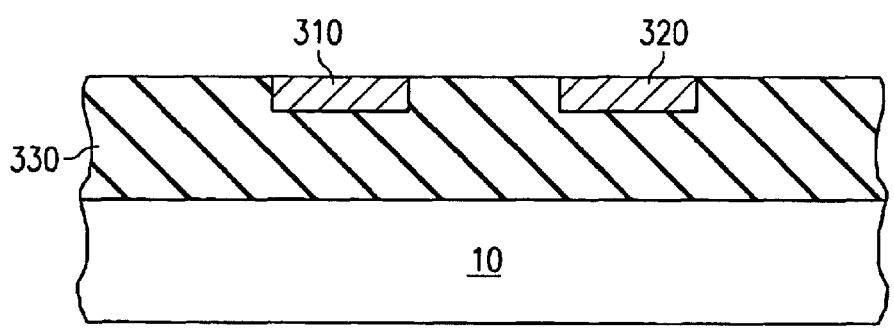
FIG. 8 is a cross sectional diagram of a lateral flux MIM capacitor.

A MIM capacitor is formed using the metal levels in the integrated circuit and the corresponding dielectric layers used to isolate them from each other. Examples of MIM capacitors are shown in FIG. 7 and FIG. 8. The substrate 10 contains devices such as MOS capacitors that are not shown for clarity. For a parallel plate MIM capacitor shown in FIG. 7, a dielectric layer 260 is formed over the substrate. A metal layer 270 is formed above the dielectric layer and functions as one plate of the MIM capacitor. The dielectric layer 280 is formed above the metal layer and a portion of the dielectric layer 280 will function as the MIM capacitor dielectric. The metal layer 290 will form the second plate of the MIM capacitor. A dielectric layer 300 is then formed above the metal layer 290. For a lateral flux MIM capacitor shown in FIG. 8, the plates of the capacitor 310, 320 are separated from each other in a dielectric layer 330. The dielectric layer 330 overlies the substrate 10 and any intervening devices and layers that have been omitted for clarity. Although only two capacitor plates 270, 290 and 310, 320 in FIGS. 7 and 8 respectively, any number of interdigitated capacitor plates can be used.

Finally, referring to FIG. 4, from 172, 180, and 184 if A>$A_{MAX}$ and $I_{TOTAL}$≦$I_{MAX}$ then Va is changed to a get a higher capacitance value using the capacitance voltage characteristic of FIG. 5(a). The above described procedure and be used to find a range of allowed Va values that will satisfy the design criteria for integrated circuit MOS capacitors.

Figure 6:
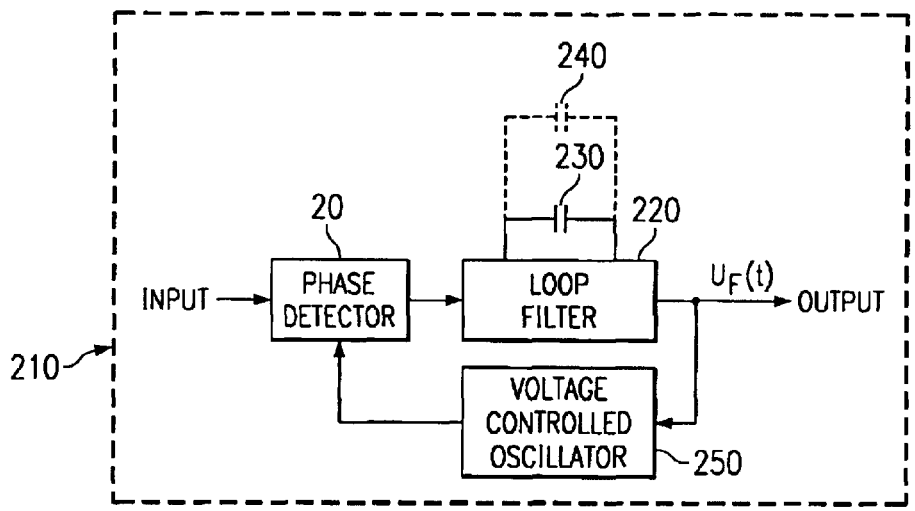
FIG. 6 is a block diagram of an integrated circuit containing a phase lock loop showing an embodiment of the instant invention.

A block diagram for an integrated circuit 210 containing a PLL circuit obtained using the method of the instant invention is shown in FIG. 6. The PLL comprises the functional blocks of a phase detector 20, loop filter circuit 220 and a voltage controlled oscillator circuit 250. In other embodiments the voltage controlled oscillator can be replaced with a current controlled oscillator. The loop filter circuit 220 will comprise one or more MOS capacitors. In FIG. 6 a single MOS capacitor 230 is shown for simplicity. The MOS capacitor 230 is biased according to the instant invention. Therefore the MOS capacitor will be biased outside of inversion (or not in inversion). If the maximum allowable capacitance obtained using the instant invention is not sufficient then an additional MIM capacitor 240 can be added in parallel. The leakage current obtained from the loop filter capacitor 230 will be much less than that obtained from a MOS capacitor biased in inversion.

In addition to the PLL described above the instant invention can be utilized in any integrated circuit where the leakage current obtained from a MOS capacitor in critical.

While this invention has been described with reference to illustrative embodiments, this description is not intended to be construed in a limiting sense. Various modifications and combinations of the illustrative embodiments, as well as other embodiments of the invention will be apparent to persons skilled in the art upon reference to the description. It is therefore intended that the appended claims encompass any such modifications or embodiments.

I claim:

1. A method to reduce leakage in integrated circuit MOS capacitors, comprising:

determine a first value of capacitance required for a MOS capacitor;

determine a maximum allowable area $A_{MAX}$ for the MOS capacitor;

determine a maximum allowable current $I_{MAX}$ for the MOS capacitor; and determine a capacitor bias voltage Va wherein said capacitor bias voltage Va results in a second capacitance value and a second capacitor current such that said second capacitance value is approximately equal to said first capacitance value and said second capacitor current is less than said maximum allowable current.

2. The method of claim 1 wherein said determining said capacitor bias voltage Va results in the MOS capacitor with an area A such that said area A is less than said maximum allowed area $A_{MAX}$.

3. The method of claim 2 wherein said capacitor area A is determined from a capacitance voltage characteristic curve.

4. A method for forming integrated circuit MOS capacitors, comprising:

determine a value of total capacitance required for an integrated circuit;

determine a capacitance value of a metal insulator metal capacitor;

determine a maximum allowable area $A_{MAX}$ for a MOS capacitor;

determine a maximum allowable current $I_{MAX}$ for the MOS capacitor; and determine a MOS capacitor bias voltage Va wherein said MOS capacitor bias voltage Va results in a MOS capacitor current and a MOS capacitor area such that said MOS capacitor current is less than said maximum allowable current and said MOS capacitor area is less than said maximum allowable area and combining the capacitance of said MOS capacitor and said metal insulator metal capacitor approximately equals said total capacitance.

5. The method of claim 4 wherein said capacitor area A is determined from a capacitance voltage characteristic curve.

6. A method for forming an integrated circuit phase lock loop, comprising:
   providing a phase detector circuit;
   providing an oscillator circuit;
   connecting said phase detector circuit and said oscillator circuit to a loop filter circuit contains one or more MOS capacitors wherein said MOS capacitors are biased to operate outside of inversion.

7. The method of claim 6 further comprising a metal insulator metal capacitor connected in parallel with at least one of said MOS capacitors.

8. An integrated circuit phase lock loop, comprising:
   a phase detector circuit;
   an oscillator circuit;
   a loop filter circuit connected to said phase detector circuit and said oscillator circuit wherein said loop filter circuit contains one or more MOS capacitors biased to operate outside of inversion.

9. The integrated circuit of claim 8 further comprising a metal insulator metal capacitor connected in parallel with at least one of said MOS capacitors.

* * * * *